(12) United States Patent
Dekker et al.

(10) Patent No.: US 6,379,987 B1
(45) Date of Patent: Apr. 30, 2002

(54) METHOD OF MANUFACTURING A HYBRID INTEGRATED CIRCUIT COMPRISING A SEMICONDUCTOR ELEMENT AND A PIEZOELECTRIC FILTER

(75) Inventors: Ronald Dekker; Wilhelmus Mathias Clemens Dolmans; Lukas Leyten; Henricus Godefridus Rafael Maas, all of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/790,346

(22) Filed: Feb. 21, 2001

(30) Foreign Application Priority Data

Feb. 22, 2000 (EP) ............................ 00200614

(51) Int. Cl.[7] ............................ H01L 21/00
(52) U.S. Cl. ............................ 438/50; 438/21
(58) Field of Search ............................ 438/21, 48, 50, 438/51, 52

(56) References Cited

U.S. PATENT DOCUMENTS

| 3,414,832 A | | 12/1968 | Newell ............................ 330/31 |
| 6,090,638 A | * | 7/2000 | Vigna et al. ............................ 438/50 |
| 6,184,051 B1 | * | 2/2001 | Ferrari et al. ............................ 438/52 |

FOREIGN PATENT DOCUMENTS

JP  2000-151451  * 5/2001

* cited by examiner

*Primary Examiner*—Chandra Chaudhari
(74) *Attorney, Agent, or Firm*—Aaron Waxler

(57) ABSTRACT

A method of manufacturing a hybrid integrated circuit comprising a semiconductor element (1) and a piezoelectric filter (2), which are situated next to each other and connected to a carrier substrate (3). The semiconductor element comprises semiconductor regions (5, 6) which are formed in a silicon layer (13, 28); the piezoelectric filter comprises an acoustic resonator (8, 9, 10) which is situated on an acoustic reflector layer (7), which acoustic resonator comprises a layer of piezoelectric material (8), a first electrode (9) situated between the layer of piezoelectric material and the acoustic reflector layer, and a second electrode (10) which is situated on the opposite side of the piezoelectric layer and faces the first electrode. In the method, the semiconductor element is formed on the first side (11) of a silicon wafer (12, 25). On the same side of this wafer, also the layer of piezoelectric material and the first electrode are formed, after which the surface is covered with the acoustic reflector layer. Subsequently, an adhesive layer (22) is used to attach the structure thus formed with the acoustic reflector layer to the carrier substrate. Finally, at the location of the filter, silicon is removed from the second side of the wafer, and the comparatively thick acoustic reflector need not be patterned so that underlying features cannot be damaged during etching said reflector layer.

9 Claims, 7 Drawing Sheets

METHOD OF MANUFACTURING A HYBRID INTEGRATED CIRCUIT COMPRISING A SEMICONDUCTOR ELEMENT AND A PIEZOELECTRIC FILTER

FIELD OF THE INVENTION

The invention relates to a method of manufacturing a hybrid integrated circuit comprising a semiconductor element and a piezoelectric filter which are provided next to each other on a carrier substrate, with the semiconductor element comprising semiconductor zones provided in a layer of silicon, and the piezoelectric filter comprising an acoustic resonator formed on an acoustic reflector layer, said acoustic resonator including a layer of a piezoelectric material, a first electrode situated between this layer and the acoustic reflector layer, and, on the other side of the layer of piezoelectric material, a second electrode situated opposite the first electrode.

The semiconductor element may be a single transistor but also an integrated circuit formed in a layer of semiconductor material and comprising a large number of transistors to which, if necessary, passive components may be added. Piezoelectric filters, also referred to as "Thin Film Acoustic Wave Resonators" can be manufactured so as to have resonant frequencies in the range between 500 MHz and 5 GHz, quality factors Q above 1,000 and small dimensions, for example a length and a width of 200 $\mu$m. The use of such filters enables hybrid integrated circuits, such as selective amplifiers, to be formed on the carrier substrate, which are particularly suitable for use in equipment for personal wireless communication, such as GSM telephony, with which signals of said frequencies are processed.

In practice, the layer of piezoelectric material may be, for example, a layer of aluminium nitride AlN or zinc oxide ZnO. These layers are applied in a thickness equal to half the wavelength with which acoustic waves of said frequencies propagate in these materials. The acoustic reflector layer on which the resonator is situated is generally composed in practice of several sub-layers of alternately a high and a low acoustic impedance. Use is customarily made of sub-layers of, for example, tungsten having a relatively high acoustic impedance of approximately 100 Gg/m$^2$s and, for example, silicon oxide or a synthetic resin having a relatively low acoustic impedance of, respectively, approximately 13 Gg/m$^2$s and approximately 2 Gg/m$^2$s. These layers are applied in a thickness which is equal to a quarter of the wavelength with which acoustic waves of said frequencies propagate in these materials. For frequencies in said frequency range, both the piezoelectric layers and the reflector layers have thicknesses in the range from 1 to 3 $\mu$m.

DESCRIPTION OF THE RELATED ART

U.S. Pat. No. 3,414,832 discloses a method of the type mentioned in the opening paragraph, where, in a first example, there is started from a carrier substrate of silicon. In this substrate, the semiconductor element, i.e. a bipolar transistor, is formed. Subsequently, the piezoelectric filter is provided next to the semiconductor element. For this purpose, first an acoustic reflector layer is locally formed on the substrate, whereafter the acoustic resonator is provided on this layer. Finally, a metallization is formed which connects the semiconductor element with the filter. In a second example, there is started from an insulating, ceramic substrate on which first a semiconductor crystal including the semiconductor element is provided. From this point, the method is carried out in the same way as described with respect to the first example.

In practice, it has been found to be difficult to provide the acoustic reflector layer next to the semiconductor element. For this purpose, such a layer must be deposited both on and next to the semiconductor element, whereafter it must be patterned by means of an etch treatment, as a result of which the layer is removed again from the semiconductor element. Deposited layers may exhibit local differences in thickness, and etch processes may locally take place at different etch rates. Consequently, in order to make sure that the layer is entirely removed from the semiconductor element, the etch treatment is carried out for a period of time exceeding the time strictly necessary to remove the layer. In practice, an "overetch time" of approximately 20% is normal. As the acoustic reflector layer is thick in comparison with layers used in semiconductor elements, it is possible that layers in the semiconductor element are entirely etched away during the "overetch" time". This may result in such damage to the semiconductor element that it can no longer be used.

SUMMARY OF THE INVENTION

It is an object of the invention to overcome the above-mentioned drawback. To achieve this, the method in accordance with the invention is characterized in that the semiconductor element is formed at a first side of an auxiliary slice of silicon, after which the layer of piezoelectric material supporting the first electrode is provided, at the same first side, on the auxiliary slice, whereafter the structure thus formed is provided over its free surface area with an acoustic reflector layer and, subsequently, attached to the carrier substrate with this layer, whereafter silicon is removed from the second side of the auxiliary slice at the location of the acoustic resonator.

After the formation of the semiconductor element, a layer of a piezoelectric material is deposited on the auxiliary slice of silicon and subsequently etched in accordance with a pattern. This layer is thin as compared to the acoustic reflector layer. The thickness of the layer of piezoelectric material practically ranges between 1 and 3 $\mu$m. Such a thin layer can be readily etched in accordance with a pattern without layers of the semiconductor element being attacked to such an extent by an "overetch time" that the semiconductor element becomes useless. The acoustic reflector layer which is applied to the semiconductor element and to the acoustic resonator is not etched in accordance with a pattern. The hybrid integrated circuit can thus be formed on the carrier substrate without the acoustic reflector layer having to be etched in accordance with a pattern.

Preferably, the semiconductor zones are formed in a top layer of a slice of silicon, which slice is provided with a silicon oxide layer situated on the top layer, after which the layer of piezoelectric material supporting the first electrode is formed on this layer of silicon oxide, whereafter the free surface of the structure thus formed is provided with an acoustic reflector layer, and the structure is subsequently attached to the carrier substrate with said layer, after which the surface of the second side of the auxiliary slice is subjected to a silicon-removal process which stops just short of the top layer, and subsequently, at the location of the acoustic resonator, silicon is removed down to the layer of silicon oxide. The first silicon-removal step, which takes place throughout the surface, may be carried out by means of a customary mechanical-chemical polishing treatment. In the second step, wherein the layer of silicon oxide is exposed at the location of the acoustic resonator, the silicon oxide layer may serve as an etch-stop layer. In an etch bath containing potassium hydroxide, silicon can be etched very selectively with respect to silicon oxide. During this etching treatment, the auxiliary slice must be masked at the location of the semiconductor element to preclude silicon from being removed at said location.

The silicon can be even more readily removed from the second side of the auxiliary slice if the semiconductor zones are formed in a top layer of a silicon slice provided with a silicon oxide layer buried under the top layer, which top layer is removed next to the semiconductor element, whereafter the layer of piezoelectric material supporting the first electrode is formed on the silicon oxide layer thus exposed, after which the free surface of the structure thus formed is provided with an acoustic reflector layer, whereafter the structure is attached to the carrier substrate with this layer, after which silicon is removed from the surface of the second side of the auxiliary slice down to the buried layer of silicon oxide. The slice used is an SOI (Silicon-On-Insulator) slice. Also in this case, a customary mechanical-chemical polishing treatment can be carried out as a first step in the removal process. In a subsequent, maskless step, silicon can be etched away until the buried layer of silicon oxide is exposed. Of an approximately 600 μm thick slice, for example, approximately 500 μm can be removed by the polishing treatment and the remainder by etching.

After the formation of the piezoelectric layer of the resonator on the auxiliary slice, the first electrode is formed thereon. The second electrode opposite the first electrode is provided on the resonator in a simple manner if, prior to the formation of the acoustic resonator on the silicon oxide layer situated at the first side of the auxiliary slice, the second electrode is provided, at the location of the acoustic resonator, after which the layer of piezoelectric material carrying the first electrode is formed on this second electrode.

A drawback of this method resides in that the layer of piezoelectric material of the resonator must be formed on said second electrode. To preclude damage to this electrode, the layer of piezoelectric material must be deposited at a comparatively low temperature. If the second electrode is formed, for example, in a layer of aluminium or tungsten, then the auxiliary slice must not be heated to temperatures above 350° C. during the deposition of the layer of piezoelectric material. To obtain a layer of piezoelectric material comprising equally oriented crystals, it may be desirable to deposit the layer at a higher temperature. This is possible if the layer of piezoelectric material is formed directly on the silicon oxide layer situated at the first side of the auxiliary slice, after which the first electrode is provided, the free surface of the structure thus formed is provided with an acoustic reflector layer, and subsequently said structure is attached to the carrier substrate with this layer, after which the layer of silicon oxide is exposed from the second side of the auxiliary slice, and subsequently this layer is provided, at the location of the acoustic resonator, with a window wherein the second electrode is provided. The layer of piezoelectric material is thus provided prior to the formation of the second electrode. Damage to this electrode caused by heating during the deposition process is thus precluded.

The piezoelectric filter must be connected in the integrated circuit to the semiconductor element. If both the first and the second electrode are connected to the semiconductor element, then two metallization layers must be formed. That is to say, viewed from the auxiliary slice, one metallization layer under the resonator and one metallization layer on top of the resonator. Since the resonator is comparatively thick, i.e. the thickness ranges from 1 to 3 μm, providing the second metallization layer is not easy. To provide this layer, it must comprise conductor tracks which extend both on and next to the comparatively thick resonator, but also conductor tracks which extend over the edge of the resonator. Particularly the latter conductor tracks are difficult to provide as they must bridge a comparatively large difference in height. This problem is circumvented if the second electrode is embodied so as to be two sub-electrodes which are both situated opposite the first electrode, so that two series-connected resonators are formed between the two sub-electrodes. In this case, only a metallization has to be formed on and next to the resonator, and said step to bridge the difference in height does not have to be taken.

A simple construction is further obtained if the auxiliary substrate is attached to the carrier substrate by means of an adhesive layer which forms part of the acoustic reflector layer, in particular if also the first electrode of the acoustic resonator forms part of the acoustic reflector layer. In practice, this is possible because an adhesive layer has a comparatively low acoustic impedance and electrode materials have a much higher acoustic impedance. The thickness of the first electrode must be chosen so as to correspond to the desired resonant frequency of the filter; the adhesive layer may be much thicker on account of its very low acoustic impedance.

These and other aspects of the invention will be apparent from and elucidated with reference to the embodiments described hereinafter.

DETAILED DESCRIPTION

Figure 1:
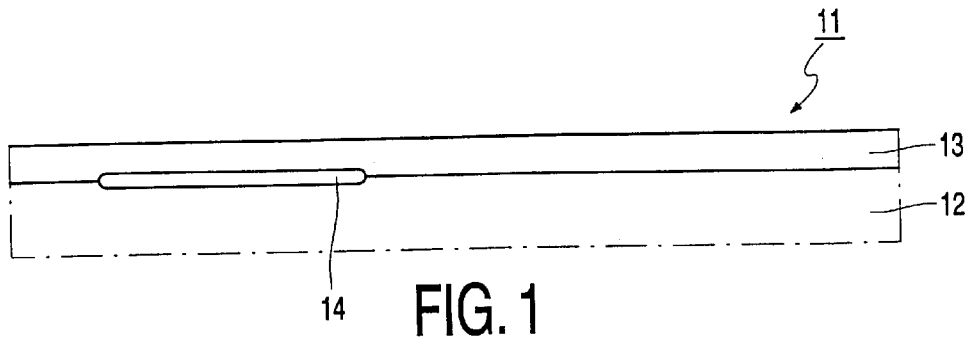
FIG. 1 through FIG. 10 are diagrammatic, cross-sectional views of a few stages in the manufacture of a first example of a hybrid integrated circuit manufactured by means of the method in accordance with the invention.

The Figures are diagrammatic and not drawn to scale, corresponding parts being referred to by the same reference numerals whenever possible. For the sake of simplicity, the semiconductor element manufactured, as illustrated in the Figures, is a single bipolar transistor. In practice, the semiconductor element may alternatively be an integrated semiconductor circuit comprising a large number of transistors to which passive elements, such as resistors, capacitors or coils may be added. The semiconductor element comprising the piezoelectric filter may form, for example, a selective amplifier capable of processing signals with frequencies between 500 MHz and 5 GHz.

Figure 10:
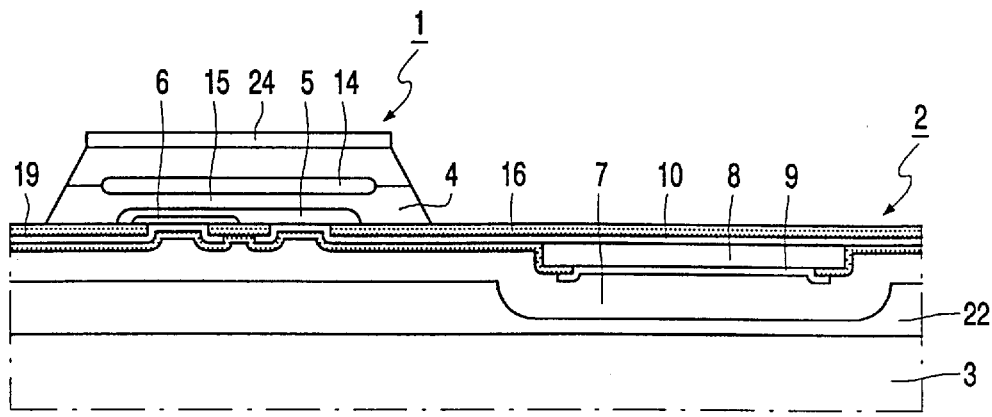

FIGS. 1 through 11 are diagrammatic, cross-sectional views of a few stages in the manufacture of a first example of a hybrid integrated circuit comprising, as shown in FIG. 10, a semiconductor element 1 and a piezoelectric filter 2 which are provided next to each other on a carrier substrate 3, the semiconductor element comprising semiconductor zones 5, 6 provided in a layer of silicon 4, and the piezoelectric filter 2 comprising an acoustic resonator 8, 9, 10 formed on an acoustic reflector layer 7, which acoustic resonator includes a layer of a piezoelectric material 8 and, situated between this layer 8 and the acoustic reflector layer 7, a first electrode 9 and, situated on the other side of the layer of piezoelectric material 8, a second electrode 10 which is situated opposite the first electrode 9.

In the examples to be described, the semiconductor element 1 is provided on a first side 11 of an auxiliary slice 12 of silicon, after which the layer of piezoelectric material 8 carrying the first electrode 9 is provided, on the same first side 11, on the auxiliary slice.

In the first example, the auxiliary slice 12 is an approximately 600 $\mu$m thick slice of silicon which is provided with an epitaxially grown, approximately 800 nm thick, top layer 13, which in this example is slightly n-type doped with approximately $5.10^{15}$ atoms per cc, and, at the location of the transistor 1 to be formed, a buried layer 14 is formed which is highly n-type doped with approximately $10^{20}$ atoms per cc. As will be described hereinafter, a part of the layer 13 forms the layer of silicon 4 wherein the semiconductor zones 5 and 6 of the transistor are formed. The layer 13 is provided with an n-type doping which may serve as a doping for the collector of the transistor to be formed. The buried layer 14 is highly n-type doped and may serve as a connection layer for the collector of the transistor 1. In the top layer 13, the approximately 200 nm deep base zone 5 having a p-type doping with a doping concentration of $5.10^{17}$ atoms per cc and the approximately 100 nm deep emitter zone 6 having a doping concentration of $2.10^{20}$ atoms per cc are formed in a customary manner. The collector zone of the transistor 1 is formed by the part 15 of the layer 13 situated below the emitter zone 6.

On the top layer 13, an approximately 600 nm thick layer of silicon 16 is formed having windows 17 and 18 enabling, respectively, the emitter zone 6 and the base zone 5 to be contacted. Outside the plane of the drawing another window is formed in the layer of silicon oxide 17 enabling the buried layer 14 and hence the collector 15 of the transistor to be contacted.

On the layer of silicon oxide 16 a metallization, for example in an approximately 500 nm thick layer of aluminium, is formed comprising conductor tracks 19 and, in the first example, the electrode 10 of the acoustic resonator 8, 9, 10 to be formed.

After the formation of the semiconductor element 1, and in this example the electrode 10, the acoustic resonator 8, 9, 10 is formed next to the semiconductor element 1 on the first side 11 of the slice 12. To this end, a layer of piezoelectric material is deposited which is subsequently etched in accordance with a pattern in such a way that the part 8 shown in FIG. 3 remains intact. In practice, the layer of piezoelectric material may be, for example, a layer of aluminium nitride AlN or zinc oxide ZnO. These layers are provided in a thickness equal to half the wavelength with which acoustic waves of said frequencies propagate in these materials. For frequencies in the frequency range between 500 MHz and 5 GHz, the piezoelectric layers have thicknesses in the range from 1 to 3 $\mu$m. This layer 8, for example, has a length and a width of approximately 200 $\mu$m.

Deposited layers may exhibit local differences in thickness, and etch processes may have locally different etch rates. Thus, in order to make sure that the layer is entirely removed from the semiconductor element, the etch treatment is carried out for a longer period of time than would be strictly necessary to etch away the layer. In practice, an "overetch time" of approximately 20% is normal. The layer of piezoelectric material has a relatively thin thickness between 1 and 2 $\mu$m. Such a thin layer can be readily etched in accordance with a pattern without layers of the semiconductor element being adversely affected to such an extent by an "overetch time" that the semiconductor element becomes useless.

On the conductor tracks 19 and the layer of piezoelectric material 8 an approximately 250 nm thick layer of silicon oxide 20 is deposited wherein a window 21 is formed, in which the approximately 1 $\mu$m thick tungsten electrode 9 is subsequently provided. This electrode is formed in a layer wherein, outside the plane of the drawing, also a connection is formed which connects the electrode 9 with one of the conductor tracks 19. The resonator 8, 9, 10 is thus formed next to the semiconductor element 1 on the auxiliary slice 12. Subsequently, an acoustic reflector layer 7 is deposited on the entire free surface of the structure thus formed and shown in FIG. 5. In this example, this acoustic reflector layer is a layer which is composed of a stack of five approximately 1 $\mu$m thick sub-layers. The 1 $\mu$m thick tungsten electrode 9 is provided with the first layer of the stack, being an approximately 1 $\mu$m thick layer of silicon oxide, on which an approximately 1 $\mu$m thick layer of tungsten is deposited, followed by an approximately 1 $\mu$m thick layer of silicon oxide, an approximately 1 $\mu$m thick layer of tungsten and, finally, an approximately 1 $\mu$m thick layer of silicon oxide. For clarity, the various sub-layers are not shown in the drawing. It is to be noted that the electrode 9 forms part of the acoustic reflector layer.

The acoustic reflector layer carrying the resonator is generally composed in practice of a few sub-layers having alternately a high and a low acoustic impedance. The customary sub-layers are made, for example, of tungsten having a relatively high acoustic impedance of approximately 100 Gg/m$^2$s and, for example, silicon oxide or a synthetic resin having a relatively low acoustic impedance of, respectively, approximately 13 Gg/m$^2$s and approximately 2 Gg/m$^2$s. These layers are applied in a thickness equal to one quarter of the wavelength with which acoustic waves of said frequencies propagate in these materials.

Figure 6:
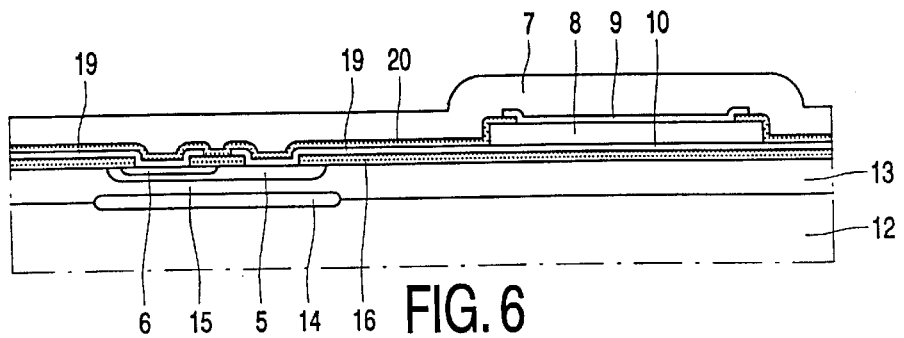
Figure 7:
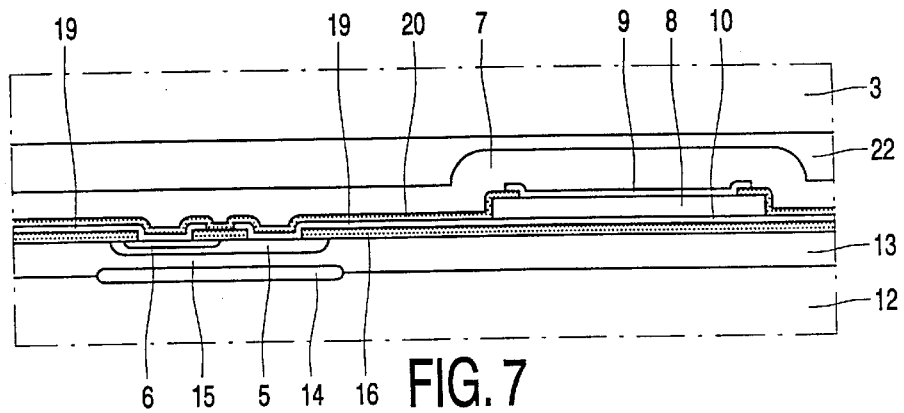
Figure 8:
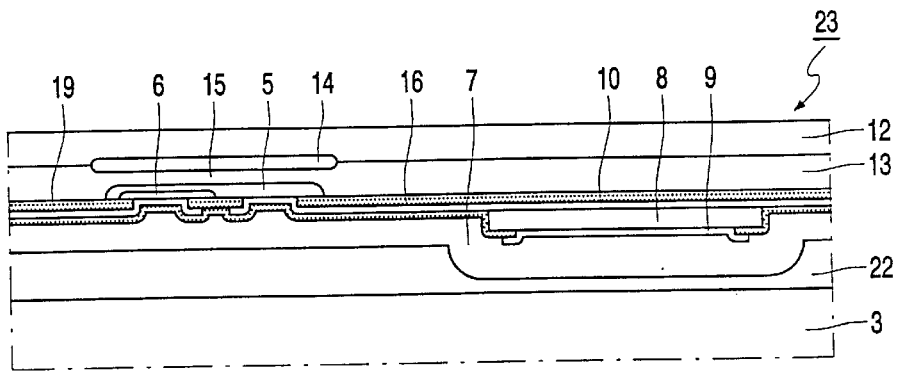
Figure 9:
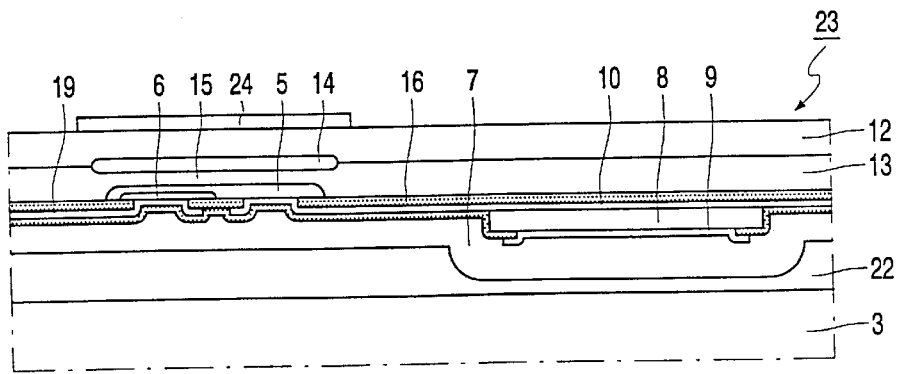

Subsequently, the structure shown in FIG. 6 is provided on the carrier substrate 3, in this example a glass plate having a thickness of a few mm, by means of a layer of an adhesive 22, for example a polyimide. Next, the entire surface of the second side 23 of the auxiliary slice of silicon 12 is subjected to a silicon-removal operation that stops just short of the top layer 13 and, subsequently, silicon is removed at the location of the acoustic resonator 8, 9, 10, down to the layer of silicon oxide 17. The first silicon-removal step, which takes place throughout the surface, may be carried out by means of a customary mechanical-chemical polishing treatment wherein 400 $\mu$m is removed from the 600 $\mu$m thick slice 12. In the second step, wherein the layer of silicon oxide 16 is exposed at the location of the acoustic resonator 8, 9, 10, the layer of silicon oxide 16 may serve as an etch-stop layer. In an etch bath containing potassium hydroxide, silicon can be very selectively etched with respect to silicon oxide. During this etch treatment, an etch mask 24 is provided at the location of the semiconductor element 1, said etch mask being formed in this case, in an approximately 200 nm thick layer of silicon nitride.

The exposed layer of silicon oxide 16 may finally be provided with windows, not shown, enabling the hybrid integrated circuit to be externally contacted.

FIGS. 11 through 18 are diagrammatic, cross-sectional views of a few stages in the manufacture of a second example of a hybrid integrated circuit comprising a semiconductor element 1 and a piezoelectric filter 2. Also in this example, the semiconductor element is a bipolar transistor comprising semiconductor zones 5 and 6 and a piezoelectric filter 2 having an acoustic resonator 8, 9, 10 formed on an acoustic reflector layer 7, said bipolar transistor and said piezoelectric filter being arranged next to each other on a carrier substrate 3.

In the second example, the auxiliary slice 25 is an approximately 600 μm thick silicon slice comprising a layer of insulating material 26 which is buried in the slice, in this case a buried layer of silicon oxide, on which layer of insulating material an approximately 100 nm thick monocrystalline silicon layer 27 is situated which is n-type doped with approximately $10^{20}$ atoms per cc. An approximately 800 nm thick top layer 28 is epitaxially formed on the layer 27, which top layer is, in this case, slightly n-type doped with approximately $5.10^{15}$ atoms per cc. This doping serves as the doping of the collector of the transistor to be formed. The layer 27 is highly n-type doped and may serve as a connection layer for the collector of the transistor 1.

In the n-type doped layer 28, an approximately 200 nm deep base zone 5 having a p-type doping with a doping concentration of $5.10^{17}$ atoms per cc and an approximately 100 nm deep emitter zone 6 having a doping concentration of $2.10^{20}$ atoms per cc are formed in a customary manner. The collector zone of the transistor 1 is formed by the part 15 of the layer 28 situated below the emitter zone 6. Subsequently, the layers 27 and 28 situated on the silicon oxide layer 26 are removed next to the transistor, so that the layer of silicon 4 wherein the semiconductor zones 5 and 6 are formed remains. Next, a layer of silicon oxide 29 is formed on this layer, said silicon oxide layer having windows 30 and 31 for contacting, respectively, the emitter zone 6 and the base zone 5.

On the layers of silicon oxide 26 and 29, a metallization is formed, for example in an approximately 200 nm thick layer of aluminium, said metallization having conductor tracks 19 and, in the second example, the electrode 10 of the acoustic resonator 8, 9, 10 to be formed.

Figure 13:
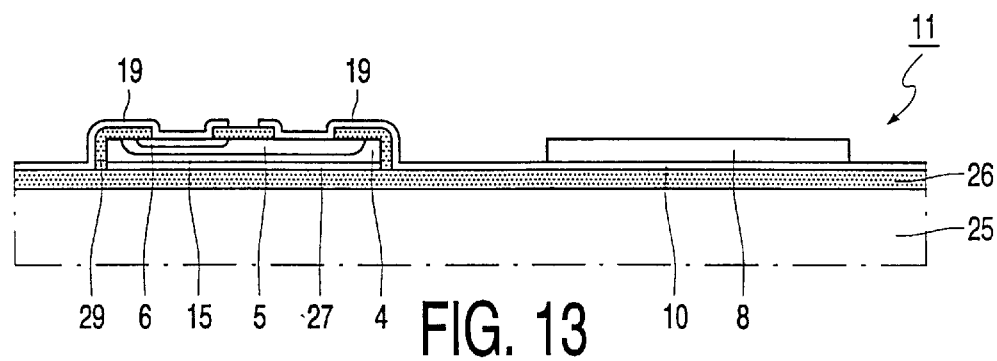
Figure 14:
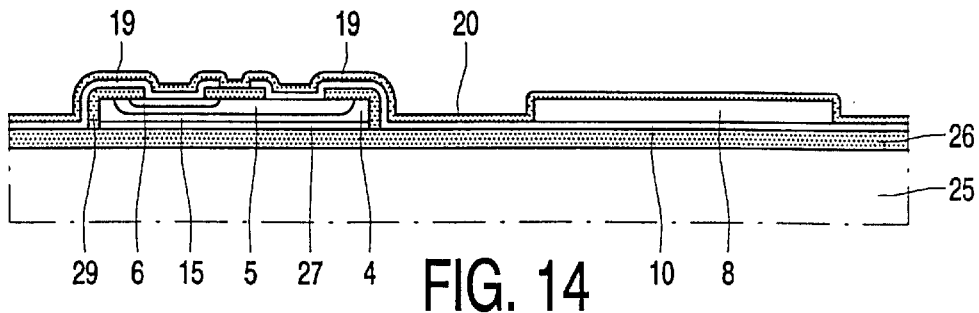
Figure 15:
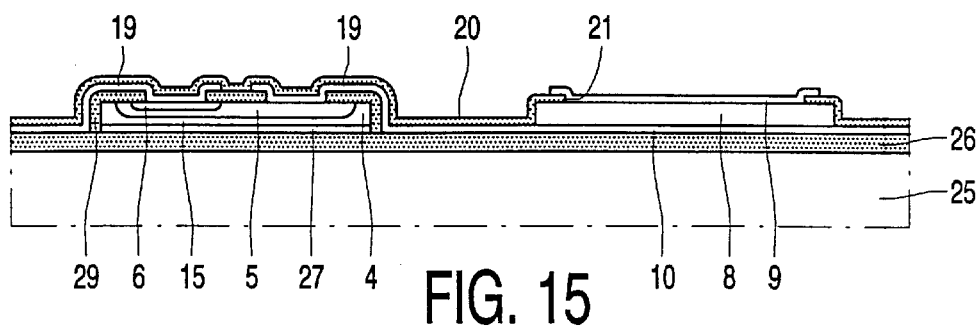

After the formation of the semiconductor element 1, and in this example the electrode 10, the acoustic resonator 8, 9, 10 is formed next to the semiconductor element 1 on the first side 11 of the slice 12. For this purpose, a layer of piezoelectric material is deposited and subsequently etched in accordance with a pattern in such a manner that the part 8 shown in FIG. 13 is preserved. This layer 8 has a length and a width of, for example, approximately 200 μm. Also in this example, the layer of piezoelectric material may be etched in accordance with a pattern without layers of the semiconductor element being adversely affected by an "overetch time" in such a manner that the semiconductor element becomes useless.

Figure 5:
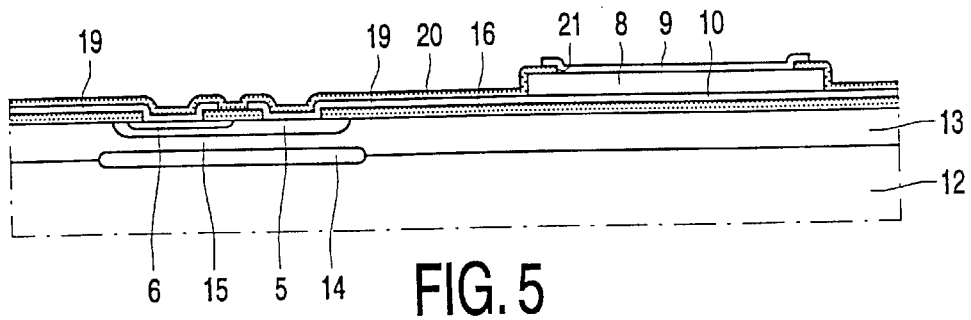

On the conductor tracks 19 and the layer of piezoelectric material 8, an approximately 250 nm thick layer of silicon oxide 20 is deposited wherein a window 21 is formed in which, subsequently, the approximately 1 μm thick tungsten electrode 9 is provided. This electrode is formed in a layer wherein also a connection is formed, outside the plane of the drawing, which connects the electrode with one of the conductor tracks 19. The resonator 8, 9, 10 is thus formed next to the semiconductor element 1 on the auxiliary slice 25. Subsequently, an acoustic reflector layer 7 is deposited on the entire free surface of the structure thus formed, which structure is shown in FIG. 5. Also in this case, the acoustic reflector layer is a layer which is composed of a stack of sub-layers of silicon oxide and tungsten.

Figure 16:
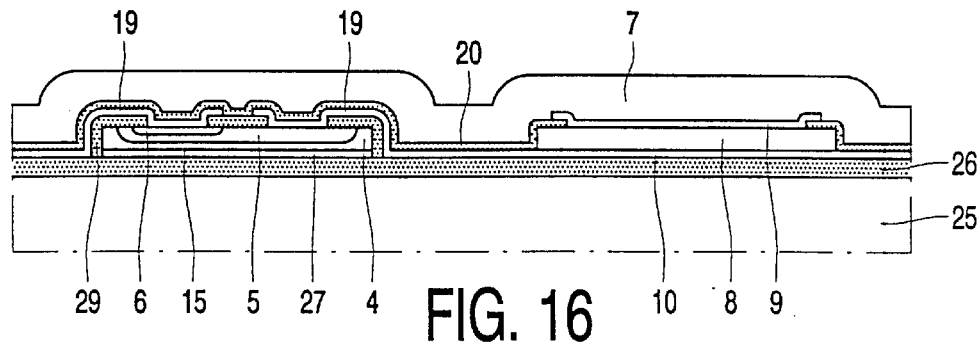
Figure 17:
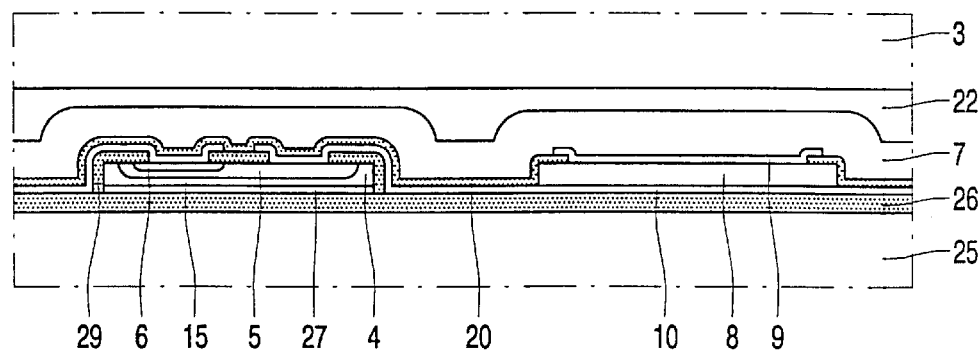
Figure 18:
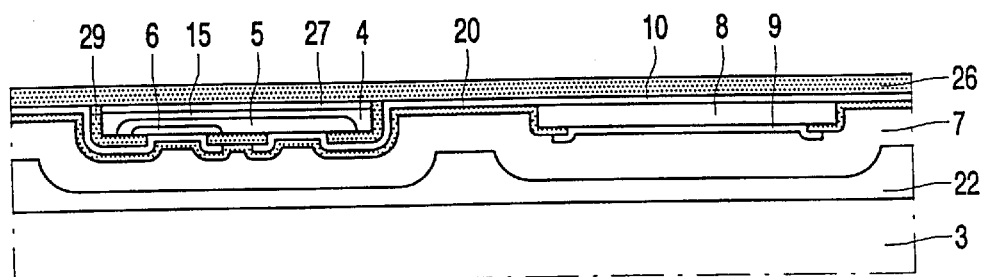

Subsequently, the structure shown in FIG. 16 is provided by means of a layer of adhesive 22, for example a polyimide, on the carrier substrate 3, in this example a glass plate having a thickness of a few mm. Next, silicon is removed from the entire surface of the second side 23 of the auxiliary silicon slice 15 down to the layer of silicon 26. Also in this case, silicon may be removed in two steps. In the first step use is made of a customary mechanical-chemical polishing treatment wherein 400 μm is removed from the 600 μm thick slice 12, and the second step is carried out in an etch bath containing potassium hydroxide. In the second example, silicon can be removed without making use of a mask, so that it is simpler than in the first example.

The exposed layer of silicon 26 may finally be provided with windows, not shown, for externally contacting the hybrid integrated circuit.

In the two examples described above, the formation of the piezoelectric layer 8 of the resonator 8, 9, 10 is followed by the formation of an electrode 9 on said layer. This electrode forms the first electrode 9 of the resonator 8, 9, 10; after the filter 2 has been mounted on the carrier substrate 3, this electrode is situated, viewed from the carrier substrate, below the resonator 8, 9, 10. In the two examples, the second electrode 10 is formed prior to the acoustic layer 8, see FIGS. 3 and 13. Subsequently, the piezoelectric layer 8 is provided on this second electrode.

Figure 2:
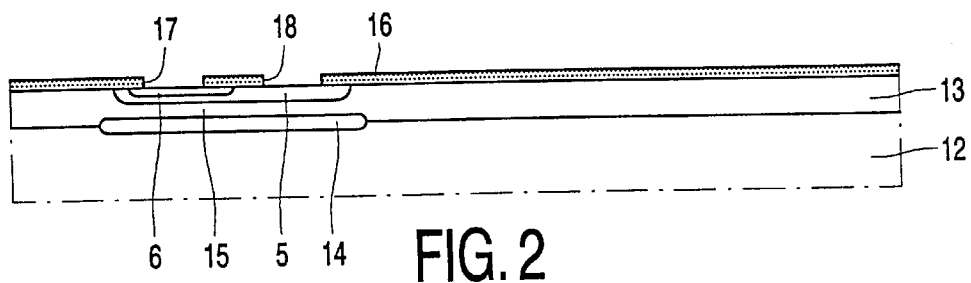
Figure 3:
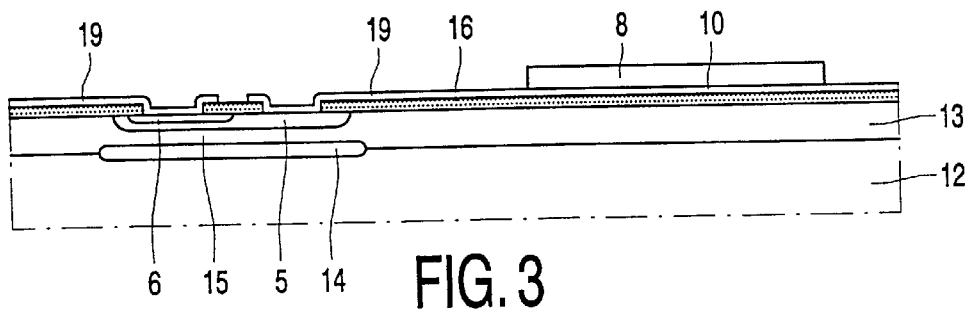
Figure 4:
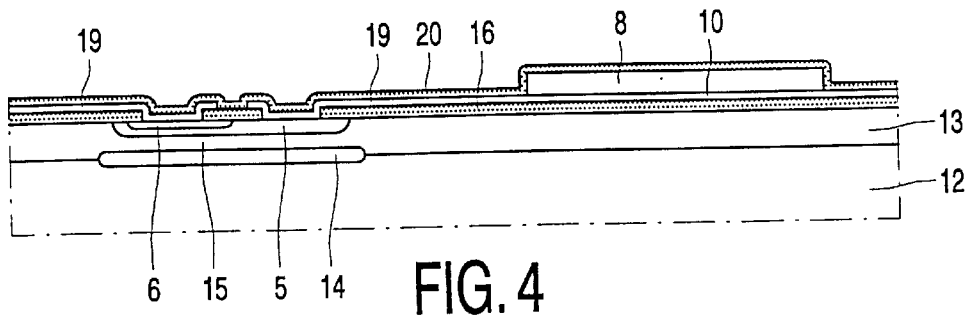
Figure 19:
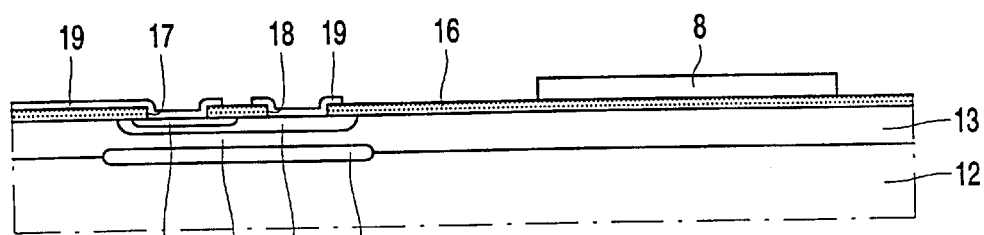
FIG. 19 through FIG. 22 are diagrammatic, cross-sectional views of a few stages in the manufacture of a third example of a hybrid integrated circuit manufactured by means of the method in accordance with the invention.

FIGS. 19 through 22 are diagrammatic, cross-sectional views of a few stages in the manufacture of a third example. The manufacture initially takes place in the same manner as shown in FIGS. 1 and 2. As shown in FIG. 19, the piezoelectric layer 8 is provided on the layer of silicon 16 before this layer is provided with the windows 17 and 18. Next, the windows 17 and 18 are formed in the layer of silicon oxide and the metallization with the conductor tracks 19 is provided.

The layer of piezoelectric material 8 is formed directly on the silicon oxide layer 16. In the two previously described examples, this layer 8 is formed on the second electrode 10. To preclude damage to the second electrode 10, the layer of piezoelectric material must be deposited at a relatively low temperature. If the second electrode is formed, for example, in a layer of aluminium or tungsten, then the auxiliary slice may not be heated to a temperature above approximately 350° C. during the deposition of the layer of piezoelectric material. To obtain a layer of piezoelectric material wherein the crystals are equally oriented, it may be desirable to deposit the layer at a higher temperature. This is possible if use is made of the method described in the third example.

After the formation of the structure shown in FIG. 19, a layer of silicon oxide 20 having a window 21 is formed, after which the first electrode 9 of the resonator 8, 9, 10 is provided in the window 21. Subsequently, the acoustic reflector layer 7 is deposited.

Figure 20:
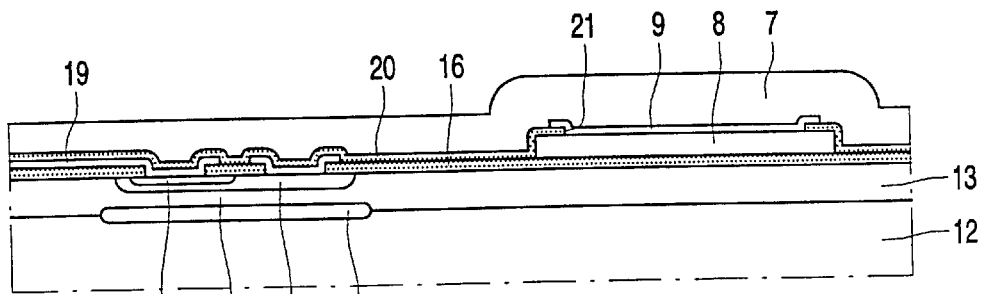
Figure 21:
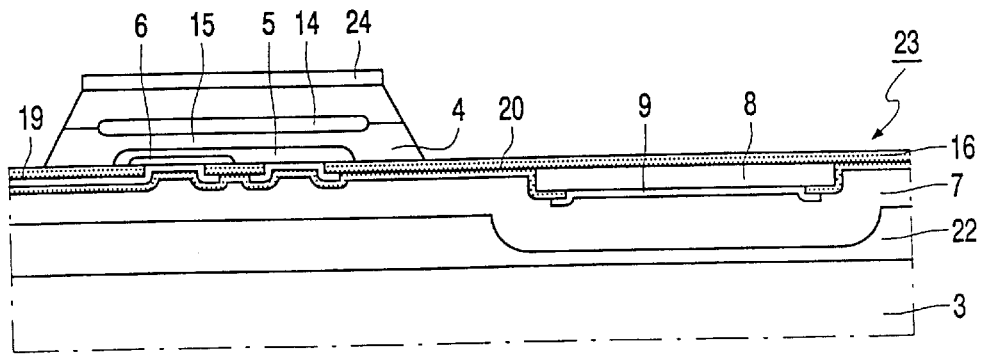
Figure 22:
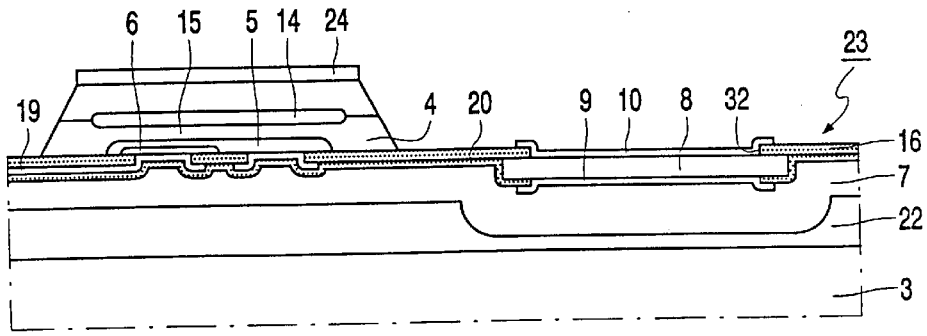

Subsequently, the structure shown in FIG. 20 is secured to the carrier substrate 3 by means of an adhesive layer 22. Next, silicon is removed from the whole surface of the second side 23 of the auxiliary slice 12, which process stops just short of the top layer 13, and, subsequently, silicon is removed at the location of the acoustic resonator 8, 9, 10 as far as the layer of silicon oxide 17. In this process, an etch mask 24 is provided at the location of the semiconductor element 1.

Finally, the layer of silicon oxide 16 is provided, at the location of the acoustic resonator, with a window 21 wherein the second electrode 10 of the resonator 8, 9, 10 is accommodated. In practice, more windows will be provided in the exposed layer of silicon oxide 16, thereby enabling the second electrode 10 to be connected to conductor tracks 19 and the hybrid integrated circuit formed to be externally contacted.

Figure 11:
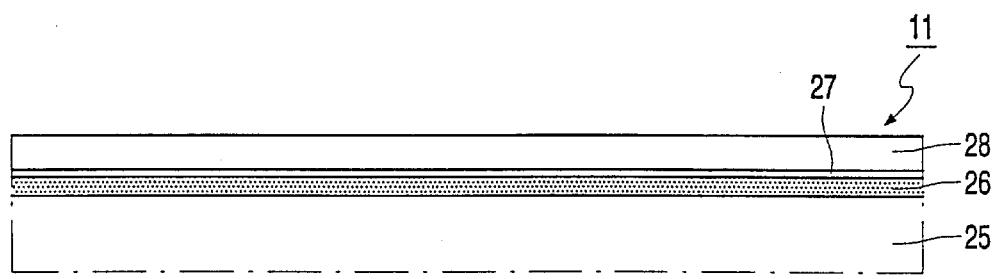
FIG. 11 through FIG. 18 are diagrammatic, cross-sectional views of a few stages in the manufacture of a second example of a hybrid integrated circuit manufactured by means of the method in accordance with the invention.
Figure 12:
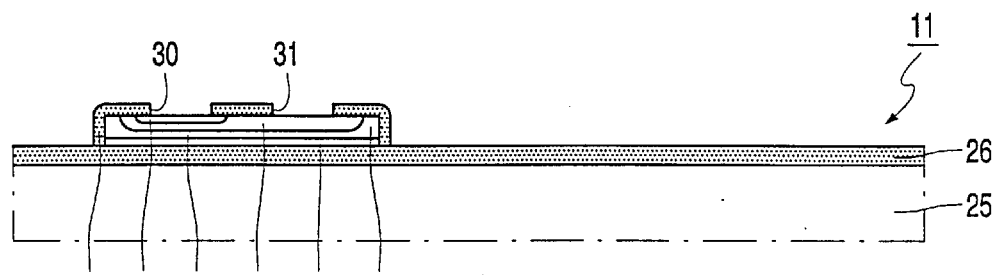
Figure 23:
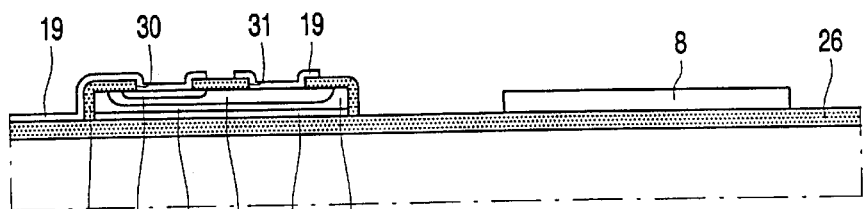
FIG. 23 through FIG. 25 are diagrammatic, cross-sectional views of a few stages in the manufacture of a fourth example of a hybrid integrated circuit manufactured by means of the method in accordance with the invention.
Figure 24:
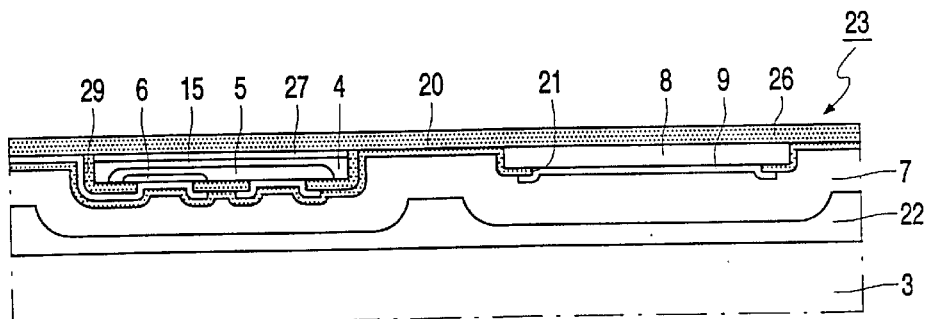
Figure 25:
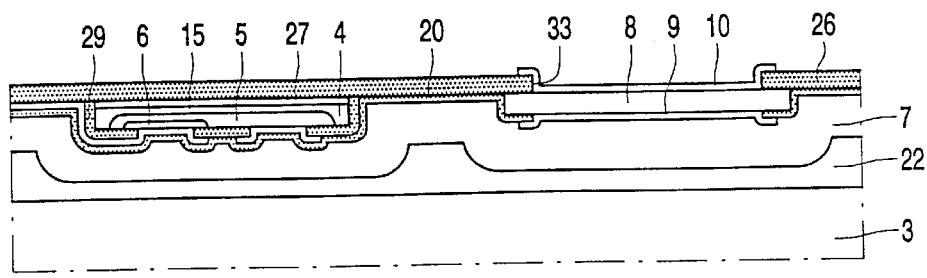

FIGS. 23 through 25 are diagrammatic, cross-sectional views of a few stages in the manufacture of a fourth example. The manufacture initially takes place as shown in FIGS. 11 and 12. As shown in FIG. 23, the piezoelectric layer 8 is formed on the layer of silicon oxide 26 before windows 30 and 31 are provided in the layer of silicon oxide 29. Subsequently, the windows 30 and 31 are formed in the layer of silicon oxide 29 and the metallization with the conductor tracks 19 is provided.

As in the third example, the layer of piezoelectric material 8 is formed directly on the layer of silicon oxide 26 instead of on the second electrode 10 as in the first and the second example. This enables, as described in the third example, the layer of piezoelectric material to be deposited at relatively high temperatures.

After the formation of the structure shown in FIG. 23, a layer of silicon oxide 20 with a window 21 is formed, after which the first electrode 9 of the resonator 8, 9, 10 is provided in the window 21. Next, the acoustic reflector layer 7 is deposited and the structure thus formed is secured to the carrier substrate 9 by means of an adhesive layer 22. Subsequently, silicon is removed from the whole surface of the second side 23 of the auxiliary slice of silicon 12 as far as the layer of silicon oxide 26.

Finally, the layer of silicon oxide 26 is provided, at the location of the acoustic resonator, with a window 33 wherein the second electrode 10 of the resonator 8, 9, 10 is accommodated. In practice, more windows will be provided in the exposed layer of silicon oxide 26, thereby enabling the second electrode 10 to be connected to conductor tracks 19 and the hybrid integrated circuit formed to be externally contacted.

Figure 26:
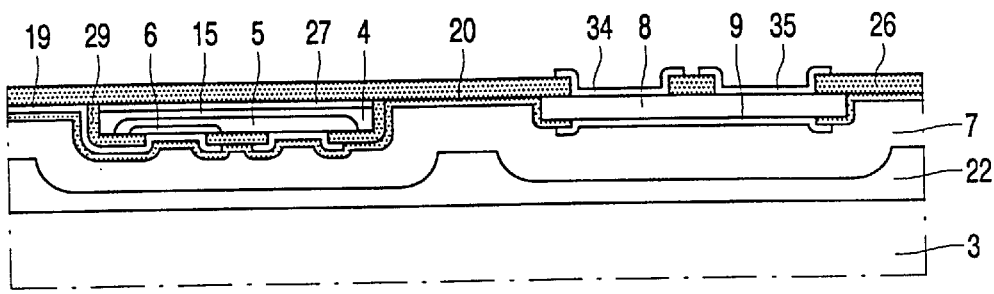
FIGS. 26, 27 and 28 are diagrammatic, cross-sectional views of a few particular solutions enabling a simplification of the manufacture of the preceding examples.
Figure 27:
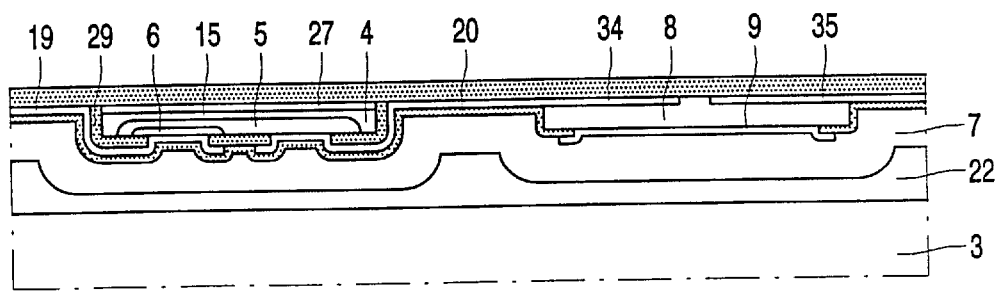

In the integrated circuit, the piezoelectric filter 2 must be connected to the semiconductor element 1. If the first electrode 9 as well as the second electrode 10 are connected to the semiconductor element 1, then two metallization layers must be formed, i.e. one with the conductors 19 and one with the first electrode 9. As the resonator is relatively thick, i.e. in the range from 1 to 3 µm, the second metallization layer with the first electrode 9 cannot be readily provided. This layer must comprise conductor tracks which are situated both on and next to the relatively thick resonator 8, but also conductor tracks which extend over the etch of the resonator. Particularly the latter conductor tracks, which must bridge a relatively large difference in height are difficult to provide. This problem is circumvented if the second electrode 10 of the acoustic resonator 8 is embodied so as to comprise two sub-electrodes 34 and 35, as shown in FIGS. 26 and 27, which are both opposite the first electrode 9, so that two series-connected resonators are formed between the two sub-electrodes 34 and 35. As a result, a metallization only has to be formed on and next to the resonator; said step to bridge the difference in height does not have to be taken. This is shown in FIG. 26 for the hybrid integrated circuit of the fourth example shown in FIG. 25, and in FIG. 27 (?) for the second example shown in FIG. 18. It will be clear that a corresponding solution will also lead to a simplification of the manufacture of the other above-described examples.

Figure 28:
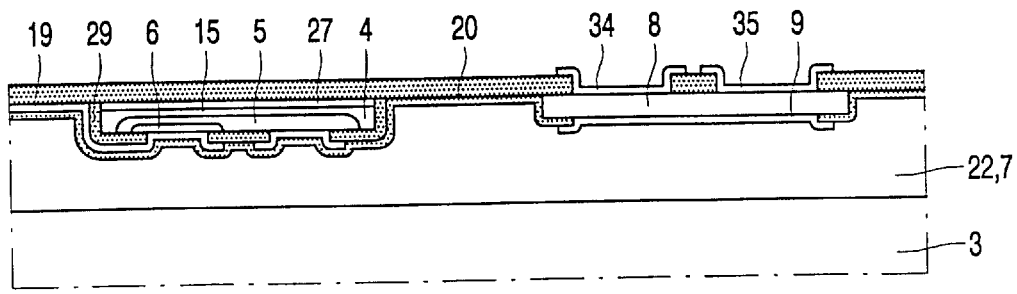

A simple construction is further obtained if the auxiliary substrate 12, 25 is secured to the carrier substrate 3 by means of an adhesive layer which forms part of the acoustic reflector layer 7, in particular if also the first electrode 9 of the acoustic resonator forms part of the acoustic reflector layer 7. This is feasible in practice because an adhesive layer exhibits a relatively low acoustic resistance and electrode materials exhibit a much higher acoustic resistance. The thickness of the first electrode 9 must be chosen so as to be in accordance with the desired resonant frequency of the filter, while the adhesive layer may have a much larger thickness on account of its very low acoustic impedance. This solution is shown for the fourth example in FIG. 28. Also in this case it will be clear that a corresponding solution will also simplify the manufacture of the other, above-described examples.

What is claimed is:

1. A method of manufacturing a hybrid integrated circuit comprising a semiconductor element and a piezoelectric filter which are provided next to each other on a carrier substrate, with the semiconductor element comprising semiconductor zones provided in a layer of silicon, and the piezoelectric filter comprising an acoustic resonator formed on an acoustic reflector layer, said acoustic resonator including a layer of a piezoelectric material, a first electrode situated between this layer and the acoustic reflector layer, and, on the other side of the layer of piezoelectric material, a second electrode situated opposite the first electrode, characterized in that the semiconductor element is formed at a first side of an auxiliary slice of silicon, after which the layer of piezoelectric material supporting the first electrode is provided, at the same first side, on the auxiliary slice, whereafter the structure thus formed is provided over its free surface area with an acoustic reflector layer and, subsequently, is attached to the carrier substrate with this layer, whereafter silicon is removed from the second side of the auxiliary slice at the location of the acoustic resonator.

2. A method as claimed in claim 1, characterized in that the semiconductor zones are formed in a top layer of a slice of silicon, which slice is provided with a silicon oxide layer situated on the top layer, after which the layer of piezoelectric material supporting the first electrode is formed on this layer of silicon oxide, whereafter the free surface of the structure thus formed is provided with an acoustic reflector layer, and the structure is subsequently attached to the carrier substrate with said layer, after which the surface of the second side of the auxiliary slice is subjected to a silicon-removal process which stops just short of the top layer, and subsequently, at the location of the acoustic resonator, silicon is removed down to the layer of silicon oxide.

3. A method as claimed in claim 1, characterized in that the semiconductor zones are formed in a top layer of a silicon slice provided with a silicon oxide layer buried under the top layer, which top layer is removed next to the semiconductor element, whereafter the layer of piezoelectric material supporting the first electrode is formed on the silicon oxide layer thus exposed, after which the free surface of the structure thus formed is provided with an acoustic reflector layer, whereafter the structure is attached to the carrier substrate with this layer, after which silicon is removed from the surface of the second side of the auxiliary slice down to the buried layer of silicon oxide.

4. A method as claimed in claim 2, characterized in that the silicon oxide layer situated at the first side of the auxiliary slice is first provided, at the location of the acoustic resonator, with the second electrode, after which the layer of piezoelectric material carrying the first electrode is formed on this second electrode.

5. A method as claimed in claim 2, characterized in that the layer of piezoelectric material is formed directly on the silicon oxide layer situated at the first side of the auxiliary slice, after which the first electrode is provided, the free surface of the structure thus formed is provided with an acoustic reflector layer, and subsequently said structure is attached to the carrier substrate with this layer, after which the layer of silicon oxide is exposed from the second side of the auxiliary slice, and subsequently this layer is provided, at the location of the acoustic resonator, with a window wherein the second electrode is provided.

6. A method as claimed in claim 4, characterized in that the second electrode is embodied so as to be two sub-electrodes which are both situated opposite the first electrode, so that two series-connected resonators are formed between the two sub-electrodes.

7. A method as claimed in claim 1, characterized in that the auxiliary slice is attached to the carrier substrate by means of an adhesive layer.

8. A method as claimed in claim 1, characterized in that the auxiliary slice is attached to the carrier substrate by means of an adhesive layer which forms part of the acoustic reflector layer.

9. A method as claimed in claim 1, characterized in that the first electrode of the acoustic resonator forms part of the acoustic reflector layer.

* * * * *